United States Patent [19]
Lorenzen et al.

[11] Patent Number: 5,173,449
[45] Date of Patent: Dec. 22, 1992

[54] METALLIZATION PROCESS

[75] Inventors: Kevin A. Lorenzen; Dan L. Burt; David A. Shumate, all of Phoenix, Ariz.

[73] Assignee: Motorola, Inc., Schaumburg, Ill.

[21] Appl. No.: 634,969

[22] Filed: Jan. 7, 1991

Related U.S. Application Data

[63] Continuation of Ser. No. 361,900, Jun. 5, 1989, abandoned.

[51] Int. Cl.$^5$ .................... H01L 21/00; H01L 21/02; H01L 21/28; H01L 21/48
[52] U.S. Cl. .................... 437/192; 437/189; 437/190; 148/DIG. 20; 257/758
[58] Field of Search ............... 437/189, 190, 192, 194, 437/200, 201, 225, 228, 245; 204/192.12, 192.15, 192.25; 357/65, 67, 71

[56] References Cited

U.S. PATENT DOCUMENTS

| | | | |
|---|---|---|---|
| 4,566,026 | 1/1986 | Lee et al. | 357/65 |
| 4,782,032 | 11/1988 | Geissberger et al. | 437/176 |
| 4,782,380 | 11/1988 | Shankar et al. | 357/65 |
| 4,787,958 | 11/1988 | Lytle | 437/192 |
| 4,927,505 | 5/1990 | Sharma et al. | 204/192.25 |

OTHER PUBLICATIONS

Meyer, Mettallurgy of TiW/Au/Cu System for TAB Assembly, J. Vac. Sci. Technol., Jun., 1985, pp. 772-776.

Nowicki, Studies of Ti-W/Au Metallization on Aluminum, Thin Solid Films, vol. 53, 1978, pp. 195-205.

Wolf, S., Silicon Processing for the VLSI Era, vol. 1, Process Technology, pp. 367 and 372, Lattice Press, 1986.

Vossen, Jr. Preparation of Surfaces for high quality interface formation, J. Vac. Sci. Tech., A2(2), Jun. 1984, pp. 212-215.

Primary Examiner—Brian E. Hearn
Assistant Examiner—B. Everhart
Attorney, Agent, or Firm—Miriam Jackson; Robert M. Handy

[57] ABSTRACT

An improved process is described for depositing TiW/-TiWN/TiW/Au metallization which provides superior adhesion properties, excellent barrier properties and which is suitable for use with metal line widths of the order of one micron or smaller. It is important in order to obtain these properties to ensure that the layer immediately underlying the gold layer by substantially pure TiW deposited in a nitrogen free sputtering atmosphere. To this end, the gas supply manifolds and deposition chamber are purged and the chamber evacuated following deposition of the TiW layer and prior to deposition of the TiWN layer underlying the gold layer. A final TiW layer is also conveniently placed on top of the gold layer to act as an etching mask.

23 Claims, 2 Drawing Sheets

METALLIZATION PROCESS

This application is a continuation of prior application Ser. No. 07/361,900, filed Jun. 5, 1989, now abandoned.

FIELD OF THE INVENTION

This invention relates, in general, to a metallization scheme for electronic devices, and more particularly, to an improved process for providing metallization for contacting semiconductor devices.

BACKGROUND OF THE INVENTION

It is well known in the electronics arts to manufacture semiconductor devices. Silicon is the most commonly used semiconductor material although other materials are also used. An important aspect of the manufacturer of semiconductor devices is the metallization used to make contact thereto.

Many different metallization schemes are known in the art. Aluminum, gold, titanium, tungsten, copper, and alloys thereof are examples of commonly used metallization materials. Frequently such materials are used in layered combinations in order to achieve properties that are not obtainable with individual materials. Titanium-tungsten (TiW) is a well known barrier and adhesion layer material. Meyer et al. discuss the use of TiW-/Au metallization for assembly purposes in a paper entitled "Metallurgy of TiW/Au/Cu System for TAB Assembly" published in *J. Vac. Sci. Technol.*, May/June '85, pp. 772-776. In this reference the chip level metallization is aluminum and the bump metallization is gold. Among other things, Meyer et al. discuss the improvements in the barrier properties of TiW that can be achieved by sputtering TiW in the presence of nitrogen to form a titanium-tungsten-nitride (TiWN), however no attempt was made to use the TiWN. Nowicki et al. has shown that TiWN has improved barrier properties over TiW, in a paper entitled "Studies of Ti-W/AU Metallization on Aluminum", published in *Thin Solid Films*. Vol. 53, 1978, pp. 195-205. The use of a TiW/-TiWN/TiW/Au metallization is discussed. The interdiffusion between aluminum and gold with the TiW/-TiWN/TiW as the barrier and adhesion metallization scheme is discussed. Here the two layers of TiW act as adhesion layers to the aluminum layer and the gold layer. TiWN acts only as a barrier layer.

Other applications for TiWN have been discussed in a paper entitled, "Reliability of High Temperature I$^2$L Integrated Circuits", by Denning et al., published in *IEEE/IRPS Proc.*, 1984, International Reliabiity Physics Symposium, pp. 30-36. wherein the use of TiWN as a barrier layer and chip interconnection metallization is discussed. Here it was found that TiWN did not adhere well to the wafer oxide or a gold layer.

While these various papers discuss the desirability of using aluminum/TiW/TiWN/TiW/Au metallization sandwiches for interconnection and/or lead attachment purposes on semiconductor devices, considerable problems remain in the preparation of these films in a practical way for volume semiconductor manufacture in order to achieve the theoretically desirable properties. Accordingly, a need continues to exist for improved manufacturing methods for forming sandwich type metallization arrangements utilizing TiW adhesion layers and TiWN barrier layers, particularly in combination with gold, aluminum, copper and other metals of interest in the semiconductor art. Accordingly, it is an object of the present invention to provide an improved metallization process for use in electronic circuits, particularly semiconductor devices and circuits.

Another object of the present invention is to provide an improved metallization process for forming metallization sandwiches employing TiW as an adhesion material and TiWN as a barrier material.

A further object of the present invention is to provide an improved fabrication process for metallization layers utilizing TiW as an adhesion material and TiWN as a barrier material in the presence of a highly electrical conducting outer layer, such as for example gold.

SUMMARY OF THE INVENTION

In accordance with the present invention, the above and other objects and advantages are provided by a process for forming conductive contact to electronic devices, comprising, providing a substrate having thereon an area to be contacted, forming on the substrate a first conductor coupled to the area to be contacted, forming a TiWN layer on the first conductor by sputtering a TiW target in a nitrogen containing atmosphere in a sputtering system, removing the nitrogen from the sputtering atmosphere without exposing the TiWN layer to an external ambient atmosphere outside the sputtering system and, thereafter forming a TiW layer on the TiWN layer by sputtering a TiW target in a substantially nitrogen free atmosphere. It is desirable that the first conductor also be a TiW layer. It is further desirable that the upper TiW layer also be covered by a further conductor, as for example, a sputtered gold layer.

It is important in carrying out the above-described process that, after completion of sputtering the TiW layer in a nitrogen containing atmosphere, that the gas manifold and sputtering system be purged with an inert gas before commencing to sputter the upper TiW layer. It is further desirable, after purging the gas manifold and sputtering system with an inert gas and before commencing sputtering the upper TiW layer, to evacuate the sputtering system and then reintroduce an inert gas for sputtering the TiW layer. Argon is a suitable inert gas. It is desirable that all of the sputtering steps to form the initial TiW layer, the TiWN layer, the upper TiW layer and the overlying (e.g.,gold) conductor layer be carried out without exposing the substrate to external ambient atmosphere. The foregoing process produces an arrangement in which the TiW layers contain substantially no nitrogen, resulting in significantly improved adhesion properties for the overall metallization structure.

DETAILED DESCRIPTION OF THE DRAWINGS

Referring now to FIGS. 1A-E, a method embodying the present invention is illustrated.

Figure 1A:
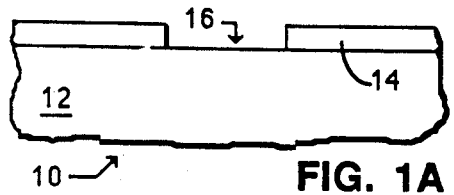
FIGS. 1A-E illustrate an embodiment of the process flow in accordance with the present invention.
Figure 1B:
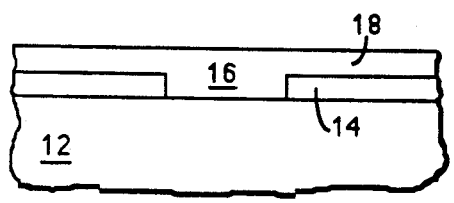

FIG. 1A shows a small portion 10 of an electronic device, as for example a transistor or integrated circuit.

Located on substrate 12 is dielectric layer 14 having opening 16 extending to the portion of substrate 12 where it is desired to make contact. The interior details of the construction of substrate 12 are not of interest in the present invention and accordingly have for simplicity been omitted. Those of skill in the art will understand that substrate 12 may be an electronic substrate, as for example, a semiconductor substrate, or a combination of a semiconductor substrate and various other conductor and dielectric layers. The present invention is concerned with an improved process for making contact to an underlying structure, whatever its nature. For convenience of explanation, substrate 12 may be considered as being a semiconductor wafer.

Dielectric layer 14 may be any of the well known dielectrics employed for passivation and insulation of electronic substrates. Silicon dioxide, silicon nitride, glasses, combinations thereof, and organic materials such as polyimides are examples of suitable dielectric materials. Silicon dioxide is convenient for layer 14. Methods for opening windows 16 in such dielectric materials are well known in the art.

First conductor layer 18 is applied over substrate 12 including window 16. Because of its desirable properties as an adhesion promoting layer, titanium-tungsten (TiW) is a desirable material for layer 18. As those of skill in the art will appreciate, layer 18 may make direct contact with the underlying semiconductor substrate or make contact via intervening conductors such as for example aluminum, aluminum-copper, doped polysilicon, or other conductors commonly used in connection with semiconductor devices.

Figure 1C:
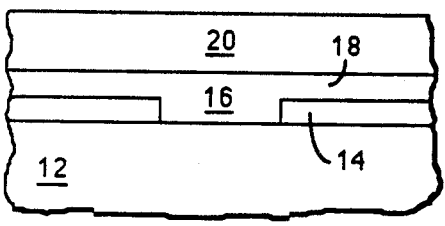
Figure 1D:
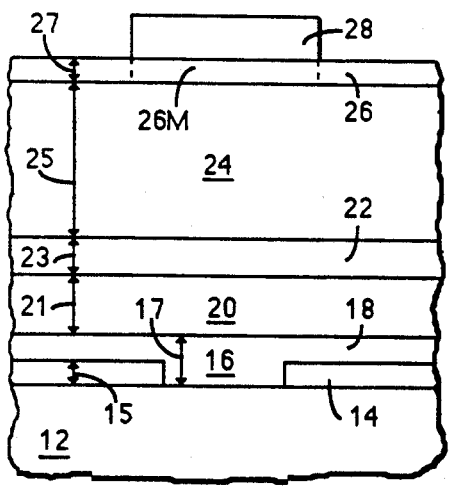

As shown in FIG. 1C, TiW layer 18 is covered with titanium-tungsten-nitride (TiWN) layer 20. As shown in FIG. 1D, layer 20 is subsequently covered by TiW layer 22. Layer 24 of, for example, gold, is then applied on TiW layer 22. This completes the metallization sandwich structure employed in a preferred embodiment. However, for convenience in processing, further sacrificial TiW layer 26 is applied on layer 24. TiW layer 26 conveniently functions as a masking layer to facilitate etching of the device to produce the finished structure shown in FIG. 1E.

Figure 1E:
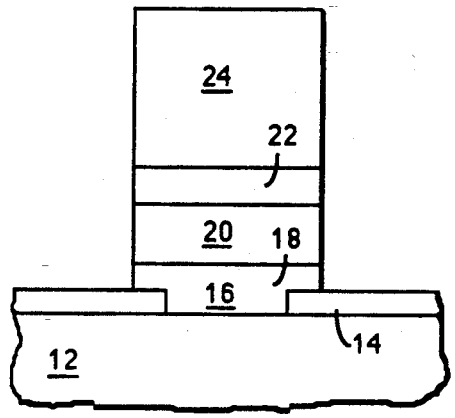

Photoresist region 28 is applied to structure of FIG. 1D using means well known in the art. Using photoresist region 28 as a mask, underlying layer 26 is then etched as shown by the dashed lines in FIG. 1D. Region 26M of layer 26 remaining under photoresist region 28 then serves as a mask during etching of gold layer 24. Gold layer 24 in turn serves as a mask during etching of layers 22, 20 and 18 so that the structure shown in FIG. 1E is finally obtained. During the course of etching layers 22, 20, 18, portion 26M of layer 26 is automatically removed.

The structure illustrated in FIG. 1E is highly desirable for contacts to semiconductor devices and integrated circuits. Layer 18 of TiW provides excellent adhesion to underlying substrate 12, whether a semiconductor or another metal, and to dielectric 14. Layer 20 of TiWN acts as a barrier layer to prevent material from conductor layer 24 migrating by solid-state diffusion to substrate 12 and interfering with the structure underlying the contact. Layer 22 of TiW acts as the adhesion layer to prevent delamination of layer 24 from TiWN layer 20. Layer 22 is especially important when layer 24 is gold because of the particularly poor adhesion exhibited by gold.

Figure 2A:
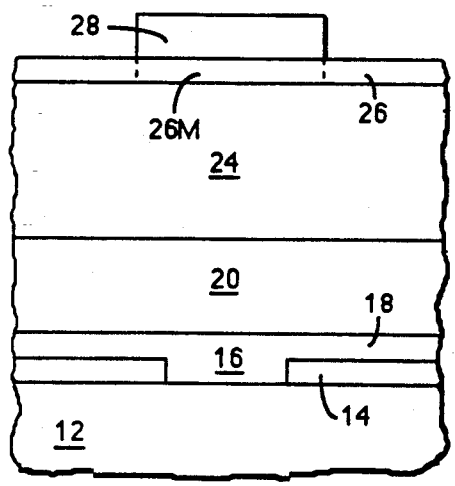
FIGS. 2A-B illustrate further embodiments analogous to FIGS. 1A-E but resulting from deviations from the process of the present invention.
Figure 2B:
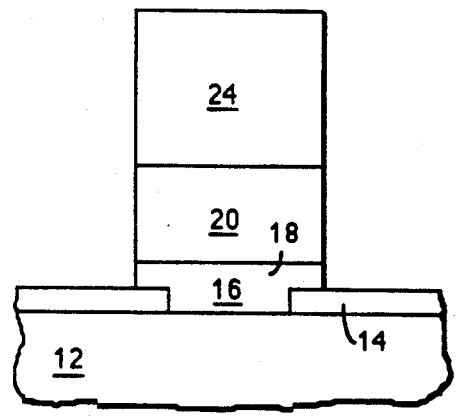

FIGS. 2A-B are similar, respectively, to FIGS. 1D and 1E, but with layer 22 omitted. In the situation illustrated in FIGS. 2A-2B, gold layer 24 is effectively in direct contact with the TiWN nitride material of layer 20. This structure arises when layer 22 of TiW is omitted either directly or accidentally.

It has been found, particularly for semiconductor devices and integrated circuits having extremely fine geometry (e.g. 1–1.25 micrometer line widths or less) that the structure of FIG. 1E gives much better results than the structure of FIG. 2B. In particular, when great care is taken to include layer 22 of substantially nitrogen free TiW, the incidence of metallization delamination is substantially reduced.

In general, delamination problems increase in severity as line widths decrease. This is in part because the aspect ratio (height/width) of fine line geometry metallization is also increasing. With metallization line widths of the order of 1-1.25 micrometers or less, it is not unusual to have aspect ratios exceeding one. Under these circumstances, it is necessary during processing to exercise great care in the fabrication of the metal stack in order to obtain the maximum interlayer adhesion By contrast, when substantially the same metallization arrangement is being used for constructing contacts intended for bonding pads (wire bond pads, solder bump pads, and the like) which typically have lateral dimensions of the order of 100 micrometers or larger, while good interlayer adhesion is important, it is not so crucial as it is in connection with metal lines having lateral dimensions of the order of one micrometer or less. Thus, while it may be possible or desirable for process simplification to omit TiW layer 18 in connection with bonding layer metallization, it is less desirable to do so in connection with fine line geometry metallization.

Figure 3:
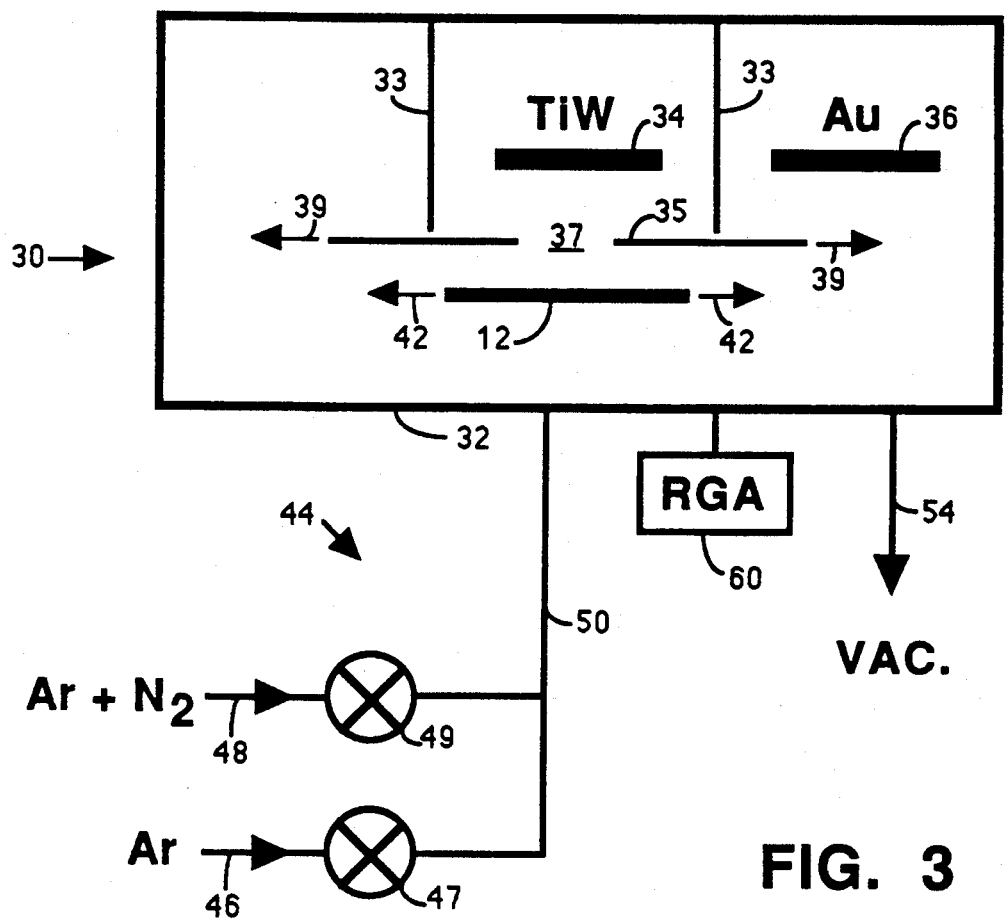
FIGS. 3 shows a highly simplified schematic diagram of a system suitable for use in depositing the metal layers employed in the process of the present invention.

FIG. 3 shows in a highly simplified and schematic manner, a typical arrangement of an apparatus for preparing TiW, TiWN and Au layers. Sputtering apparatus 30 shown in FIG. 3 is typical of those commonly used in the art for depositing TiW, TiWN and conductor layers, and comprises chamber 32 containing at least TiW target 34 and conductor target (e.g., gold) 36 separated by baffle 33. Movable shield 35 (see arrows 39) having window or opening 37 separates movable substrate 12 (see arrows 42) on which the metal layers are desired to be deposited from targets 34, 36. Substrate 12 and window 37 in shield 35 may be moved within chamber 32 so as to be aligned with target 34 or target 36. Movable shield 35 and substrate 12 permit one to initiate the sputtering discharge at a particular target and allow it to stabilize before aligning window 37 and substrate 12 with the target to commence sputtering on substrate 12. While sputtering system 30 is shown as having two chambers containing two different target materials, those of skill in the art will appreciate that system 30 may contain a multiplicity of chambers allowing other materials to be sputtered as well. Those of skill in the art will also understand that movable shutters or other means for protecting substrate 12 may be used instead of shield 35 with window 37 and that the present invention does not require the particular geometric arrangement illustrated in FIG. 3 which is presented merely for purposes of explanation and limitation.

Target 34 is conveniently a mixture of Ti and W. The Ti/W ratio used depends upon the desired composition of the deposited layer and the relative sputtering rates of Ti and W in the sputtering gases used. A mixture of, for example, 14% Ti and 86% W was found to be convenient, but other Ti/W ratios may also be used. Also, as those of skill in the art will understand, the target may be composed of separate regions to Ti and W having the appropriate area ratio rather than a substantially homogeneous mixture.

The sputtering atmosphere within chamber 32 is controlled by gas manifold 44, comprising, for example, first gas inlet 46 with regulating valve 47, and second gas inlet 48 with regulating valve 49, which join inlet tube 50 which conducts gas into chamber 32. Vacuum line 54 is provided extending from chamber 32 to a vacuum pump (not shown) for removing gases from within chamber 32. For sputtering TiW, TiWN and Au, it is convenient to use a combination of inert gas and nitrogen. The inert gas argon is suitable for sputtering gold and TiW. A mixture of argon plus nitrogen (Ar+N$_2$) is suitable for sputtering TiWN. TiWN may also be produced by sputtering a TiWN target in an inert gas, e.g., argon, but this approach requires at least three targets within the sputtering system.

It has been found that the details of operation of such a typical sputtering system are extremely important to achieving high quality fine line geometry metallization employing titanium-tungsten (TiW), titanium-tungsten-nitride (TiWN) and other conductors, e.g., gold, copper, aluminum or alloys. In particular, it is essential that after depositing the TiWN layer, that the system be carefully purged so as to remove substantially all nitrogen. In this way the subsequent step of sputtering TiW layer 22 can be carried out in a sputtering atmosphere which is substantially free of nitrogen so that TiW layer 22 is also substantially nitrogen free. It has been found that if this precaution is not exercised, even small amounts of nitrogen remaining within the system are incorporated in trace amounts in layer 22 and adversely affect the adhesion properties of the metal stack in fine line geometry applications. It is also important, that the sputtering of the various TiW/TiWN/TiW and Au, Cu, Al or alloy layers be carried out without opening sputtering system 30 or exposing substrate 12 to the external ambient atmosphere. This is to prevent, among other things, the formation of intervening oxide or moisture layers which may adversely affect the electrical conductivity and the adhesion between the various layers.

EXAMPLE

The following is an example of the practice of the method of the present invention according to a preferred embodiment.

Substrate 12 consists of a silicon semiconductor wafer. Passivation layer 14 is formed of silicon oxide or silicon nitride or combinations thereof, with silicon oxide being preferred. Sputtering is carried out in a type MRC-603 sputtering system manufactured by the Materials Research Corporation, Orangeburg, N.Y. Two targets are provided within the sputtering chamber; a TiW target comprising 14% Ti and 86% W, and a substantially pure gold target. After placing silicon substrate 12 within the system, the system is evacuated to approximately $5 \times 10^{-7}$ Torr or less.

Valve 47 is opened to introduce argon into the system and a discharge initiated within the portion of chamber 32 containing TiW target 34 while shield 35 is in place. After the discharge has stabilized, window 37 and substrate 12 are moved to face target 34. Typically, 0.05 micrometers of TiW are deposited on substrate 12. While a thickness of approximately 0.05 micrometers is preferred for TiW layer 18, 0.02-0.08 micrometers is useful with the narrower range of 0.04-0.06 micrometers being convenient. Deposition is typically carried out at a gas pressure in the range of $4-22 \times 10^{-3}$ Torr, with 9 to $15 \times 10^{-3}$ Torr being typical. Deposition takes approximately one minute.

Following completion of deposition of TiW layer 18, the plasma is extinguished and argon valve 47 closed. Valve 49 is then opened to introduce the argon-nitrogen mixture into the deposition chamber. Argon-nitrogen gas mixture 48 conveniently has a composition of about 13-15% nitrogen by weight, however argon-nitrogen mixtures in the range 10-30% nitrogen are believed to be suitable.

Sufficient time is allowed to pass until the nitrogen partial pressure within deposition chamber 32 reaches equilibrium as indicated by residual gas analyzer 60. This occurs generally within two to three minutes. The plasma is ignited with shield 35 in place and, as soon as the discharge has stabilized, window 37, substrate 12 and target 34 are aligned to begin deposition of TiWN. Thickness 21 of TiWN layer 20 is desirably in the range 0.2-0.5 micrometers, with 0.25-0.35 micrometers being convenient, and about 0.28 micrometers being typical. This thickness of TiWN is deposited in approximately five minutes.

Following completion of the TiWN deposition, the plasma is extinguished and the argon-nitrogen mixture shut off by closing valve 49. It is desirable at this point to open valve 47 to purge line 50 and chamber 32 with pure argon for a period of several minutes, usefully 2 to 10 minutes, more conveniently 3-7 minutes and typically 5 minutes, in order to force any remaining nitrogen out of inlet line 50 and dilute the nitrogen which may remain within chamber 32. By monitoring the nitrogen partial pressure using residual gas analyzer 60, the amount of nitrogen remaining within deposition chamber 32 may be determined. It is found that after approximately five minutes, the nitrogen partial pressure decreases to approximately 1/1000 of its value during deposition. While this is believed sufficient to remove substantially nearly all residual nitrogen from line 50 and chamber 32, it has been found desirable to shut valve 47 and pump chamber 32 down to a vacuum of approximately $1 \times 10^{-6}$ to $5 \times 10^{-7}$ Torr or less. This ensures that the residual nitrogen in chamber 32 has been reduced to negligible amounts.

Valve 47 is then reopened to refill the chamber with argon to the same pressure range used for the previous depositions, the plasma ignited and stabilized, and window 37, substrate 12 and target 34 aligned in order to once again deposit TiW on substrate 12 to form layer 22. Thickness 23 of layer 22 is typically substantially the same as thickness 17 of layer 18. Substantially the same deposition time is required. During deposition of TiW layer 22, the atmosphere within chamber 32 is substantially nitrogen free. Following completion of TiW layer 22, the plasma around target 34 is extinguished. The next step is to sputter conductor (e.g., gold) layer 24.

Argon at about the same pressures as used for the previous depositions is convenient for sputtering gold layer 24 onto substrate 12. Thickness 25 of layer 24 is usefully in the range 0.5-2.0 micrometers, conveniently 0.8-1.6 micrometers and typically 1.0-1.4 micrometers. Run time is approximately 5-8 minutes. The same general procedure is used, i.e., the plasma is initiated around target 36 while shield 35 is in place, after the discharge stabilizes, window 37, substrate 12 and target 36 are aligned so that material from target 36 deposits on substrate 12 through window 37. Following completion of gold layer 24 the plasma is once again extinguished.

The next step is to deposit layer 26 of TiW on gold layer 24, using substantially the same procedure as followed for layer 18. Substrate 12 is moved back underneath TiW target 34. Layer 26 of TiW has thickness 27 in the range usefully of 0.1-0.4 micrometer, more conveniently in the range 0.2-0.3 micrometers and typically in the range 0.22 -0.23 micrometers. The purpose of TiW layer 26 is to act as an etch mask for etching layer 24.

It is important during the deposition of layers 18, 20, 22, 24, 26 to keep substrate 12 within deposition chamber 32 so that is not exposed to the external ambient atmosphere but only to the controlled argon, argon plus nitrogen or vacuum ambients within chamber 32.

Thickness 27 of layer 26 is usefully 3 to 6 times, and more conveniently 4 to 5 times the thickness of layers 18 or 22, and approximately 1/10th the thickness of layer 24. This is important because layer 26 may be eroded during etching of layer 24. Therefore, the thickness ratios of layer 26 and 24 must be sufficient to permit layer 26 to withstand the etching steps required to remove the desired portions of layer 24.

It has been found that the TiW layers are conveniently etchable in hydrogen peroxide. A process for performing this etching is described, for example, in U.S. Pat. No. 4,787,958 to Lytle, which is incorporated herein by reference. TiW and TiWN (e.g, layers 26, 22, 20, and/or 18) are also conveniently plasma etched in a gas ambient comprising $SF_6+He$ or $SF_6+SiCl_4$. Gold layer 24 is conveniently sputter-etched in an argon-oxygen mixture. It is desirable to provide a nitric acid boil after etching gold layer 24 and before etching layer 22 in order to remove residual gold which re-deposits during the gold sputter-etching process. After etching layer 24 using region 26M of layer 26 as a sacrificial mask, layers 22, 20 and 18 are etched to provide the configuration of FIG. 1E. TiW layer 18 may be conveniently finally etched in hydrogen peroxide if it is found that plasma etching leaves a residue.

By now it should be appreciated that there has been provided an improved metallization process for depositing TiW/TiWN/TiW/Au (or other top conductor materials) metallization layers which incorporate excellent adhesion and barrier properties and which are suitable for use with very fine line geometries. It has been found that the adhesion properties of layer 24, particularly when of gold, to the underlying layers depend sensitively upon the residual nitrogen content within deposition chamber 32 during deposition of the layer which immediately underlies layer 24. Accordingly, it is important that substantial effort be made as has been described for example herein, to reduce the residual nitrogen content with deposition chamber 32 so that layer 22 is deposited substantially in a nitrogen free atmosphere.

It will be appreciated by those of skill in the art that the deposition geometry illustrated in FIG. 3 is merely for purposes of explanation, and that many different types of sputter deposition reactors may be used in connection with the present invention. Further, those of skill in the art will also appreciate based on the information provided herein that the argon-nitrogen mixture may be introduced into the deposition chamber in a variety of different ways without departing from the spirit and scope of the present invention. Further, those of skill in the art will appreciate that substrate 12 may be made of a variety of materials. Those of skill will also understand that even though argon has been described as a preferred gas for sputter deposition of TiW and gold, other substantially inert gases may also be used. In addition, while gold has been described as being used for the final outer conductor layer of the metallization sandwich (layer 26 being a sacrificial layer), other highly electrically conducting materials could also be used in place of or with gold. Accordingly, it is intended that these and such other variations as will occur to those of skill in the art based upon the disclosures herein be included in the claims that follow.

We claim:

1. A process for forming a conductive contact to an electronic device, comprising:

providing a substrate having thereon an area to be contacted;

forming a TiWN layer on the first conductor coupled to the area to be contacted;

forming a TiWN layer on the first conductor by sputtering a TiW target in a nitrogen containing sputtering atmosphere in a sputtering system;

removing the nitrogen from the sputtering atmosphere by purging the sputtering system with a substantially inert gas; and without exposing the TiWN layer to an oxygen or moisture containing atmosphere, thereafter forming a TiW layer on the TiWN layer by sputtering a TiW target in a substantially nitrogen free atmosphere after the step of removing the nitrogen such that an abrupt TiW/TiWN interface is formed thereby preventing the formation of a TiWN gradient interface between the TiW and TiWN layers.

2. The process of claim 1 wherein the final forming step comprises forming the TiW layer on the TiWN layer by sputtering the same TiW target as used for forming the TiWN layer.

3. The process of claim 2 wherein the final forming step comprises forming the TiW layer on the TiWN layer by sputtering the same TiW target as used for forming the TiWN layer and in the same sputtering system.

4. The process of claim 1 further comprising, without intervening exposure of the TiW layer to an oxygen or moisture containing atmosphere, forming another conductor layer on the TiW layer.

5. The process of claim 4 wherein the step of forming another conductor layer on the TiW layer comprises forming a gold layer on the TiW layer.

6. The process of claim 1 wherein the step of providing a substrate having thereon an area to be contacted comprises providing a substrate, forming a dielectric on the substrate and forming an opening through the dielectric extending to the area to be contacted.

7. The process of claim 1 wherein the step of forming the TiWN layer comprises sputtering a TiW target in a sputtering atmosphere comprising 10-30% nitrogen by weight in argon.

8. The process of claim 1 wherein the step of forming a first conductor comprises forming a layer comprising TiW as the first conductor.

9. The process of claim 8 further comprising, after the step of forming the TiW layer on the TiWN layer, sputtering a further conductor layer on the TiW layer on the TiWN layer without intervening exposure of the TiW layer on the TiWN layer to an oxygen or moisture containing atmosphere.

10. A process for forming a conductive contact to a semiconductor device, comprising:

providing a semiconductor substrate having a contact region thereon;

providing a first metal layer coupled to the contact region;

exposing the first metal layer to a nitrogen containing atmosphere in a sputtering system;

covering the first metal layer with a second TiWN layer by sputtering Ti and W or TiW in the nitrogen containing atmosphere in the same sputtering system;

removing the nitrogen from the atmosphere in the sputtering system by purging the sputtering system with a substantially inert gas; and without exposing the TiWN layer to an oxygen or moisture containing atmosphere, covering the TiWN layer with a third TiW layer by sputtering Ti and W or TiW in a substantially nitrogen free atmosphere in the same sputtering system after the step of removing the nitrogen such that an abrupt TiW/TiWN interface is formed thereby preventing the formation of a TiWN gradient interface between the TiW and TiWN layers.

11. The process of claim 10 further comprising, covering the third TiW layer with a fourth conductive layer.

12. The process of claim 11 wherein the step of covering the third layer with a fourth layer comprises sputtering Au in a substantially nitrogen free atmosphere in the same sputtering system.

13. The process of claim 10 wherein the step of providing the first metal layer comprises sputtering Ti and W or TiW in a substantially inert atmosphere in the same sputtering system used for the second and third layers.

14. The process of claim 10 wherein the step of exposing the first metal layer to a nitrogen containing atmosphere comprises exposing the first metal layer to an atmosphere comprising 10–30% nitrogen by weight in argon.

15. The process of claim 14 wherein the step of removing the nitrogen from the atmosphere in the sputtering system comprises evacuating the sputtering system.

16. The process of claim 15 wherein the first conductor layer has a first thickness, the second TiWN layer has a second thickness and the third TiW layer has a third thickness, and wherein the first and third thicknesses are less than the second thickness.

17. The process of claim 16 further comprising providing a fourth conductor layer having a fourth thickness on the third layer, and wherein the fourth thickness is three to five times the second thickness.

18. A process for forming a barrier layer contact on a semiconductor substrate, comprising:

providing a semiconductor substrate having a contact region thereon;

applying a TiW containing layer coupled to the substrate by sputtering in an inert atmosphere in a sputtering system;

flowing a nitrogen plus inert gas mixture through the sputtering system until a stable gas composition is obtained within the sputtering system;

applying a TiWN layer by sputtering Ti and W or TiW in the nitrogen plus inert gas mixture;

flushing the sputtering system with a gas containing substantially no nitrogen to remove residual nitrogen from the sputtering system; and without exposing the TiWN layer to an oxygen or moisture containing atmosphere, thereafter applying a TiW layer on the TiWN layer by sputtering Ti and W or TiW with a substantially nitrogen free gas such that an abrupt TiW/TiWN interface is formed thereby preventing the formation of a TiWN gradient interface between the TiW and TiWN layers.

19. The process of claim 18 further comprising after the flushing step, evacuating the system and then introducing the nitrogen free sputtering gas.

20. The process of claim 19 further comprising applying a further conductor on the second TiW layer and applying a still further TiW layer to the further conductor layer.

21. The process of claim 1 further comprising the step of evacuating the sputtering system to ensure that only a negligible amount of nitrogen is present in the sputtering atmosphere after the step of removing the nitrogen and thereafter introducing the substantially nitrogen free sputtering gas.

22. The process of claim 1 further comprising the step of evacuating the sputtering system to ensure that only a negligible amount of nitrogen is present in the sputtering atmosphere after the step of removing the nitrogen and thereafter introducing the substantially nitrogen free sputtering gas.

23. A process for forming a conductive contact to an electronic device, comprising:

providing a substrate having thereon an area to be contacted;

forming on the substrate a first conductor coupled to the area to be contacted;

forming a TiWN layer on the first conductor by sputtering a TiW target in a nitrogen containing sputtering atmosphere in a sputtering system by introducing a flow of a gas comprising nitrogen into the sputtering system;

shutting off the flow of the gas comprised of nitrogen into the sputtering atmosphere;

removing any residual nitrogen remaining in the sputtering atmosphere by purging the sputtering system with a substantially inert gas after the step of shutting off the flow of gas comprising nitrogen;

evacuating the sputtering system by pumping down the sputtering system to ensure that only a negligible amount of nitrogen is present in the sputtering atmosphere; and without exposing the TiWN layer to an oxygen or moisture containing atmosphere, thereafter forming a TiW layer on the TiWN layer by sputtering a TiW target in a substantially nitrogen free atmosphere after the step of evacuating the sputtering system.

* * * * *

UNITED STATES PATENT AND TRADEMARK OFFICE
CERTIFICATE OF CORRECTION

PATENT NO. : 5,173,449
DATED : December 22, 1992
INVENTOR(S) : Kevin A. Lorenzen It is certified that error appears in the above-indentified patent and that said Letters Patent is hereby corrected as shown below:

In claim 1, column 8, line 17, delete "a TiWN layer on the" and insert --on the substrate a--.

Signed and Sealed this

Sixteenth Day of December, 1997

Attest:

BRUCE LEHMAN

Attesting Officer

Commissioner of Patents and Trademarks